Aug. 18, 1964 G. F. HARDY 3,145,126

METHOD OF MAKING DIFFUSED JUNCTIONS

Filed Jan. 10, 1961

*INVENTOR.*
GEORGE F HARDY
BY Fenway, Finney & Hildreth
ATTORNEYS

United States Patent Office 3,145,126

Patented Aug. 18, 1964

3,145,126

METHOD OF MAKING DIFFUSED JUNCTIONS

George F. Hardy, Framingham, Mass., assignor to Clevite Corporation, a corporation of Ohio Filed Jan. 10, 1961, Ser. No. 81,833
3 Claims. (Cl. 148—187)

This invention relates in general to the preparation of semiconductor materials, and in particular to the control of diffused impurities in semiconductor materials.

In the preparation of double diffused transistors, the impurity or doping material is deposited upon a slice of semiconductor material. In the deposition process, the impurity becomes deposited upon both sides of the slice. It is necessary then to remove the deposited impurity from one side of the slice in order that an unwanted junction will not be formed on the device. Removal of the deposit is accomplished either by etching or by some mechanical expedient such as lapping or sandblasting the one side of the slice.

Although the technique briefly described is almost universally used at present, there are several drawbacks which are encountered. Because the slices of semiconductor material are of necessity extremely thin, they are very fragile. The handling of the slices and the mechanical operations which must be performed upon them to remove the unwanted deposit inevitably result in a considerable amount of breakage. The same operations and handling also quite frequently result in unintentional scratching or etching of the deposit which is to be retained. That is, the deposit which makes up the desired junction becomes damaged These difficulties have not gone unrecognized, and some effort has been made to improve the process. For example, attempts have been made to limit the deposition of impurities only to the side of the slice on which the desired junction is to be formed. However, if masking or similar efforts are attempted at this point, the doping of the semiconductor slice is unpredictable because of contaminating effects of the masking material. Moreover, the techniques and the handling of the slice of material have lead to much the same type of difficulty as that encountered in following the process described above. Finally, in a process of this type as in the process described above, the surface of the slice opposite that where the desired junction is to be formed constitutes a relatively poor area for the making of an ohmic contact of the type required for a transistor base connection.

It is, therefore, a primary object of the present invention to reduce breakage of semiconductor slices during their preparation.

It is another object of the present invention to eliminate mechanical damage such as scratching of desired junctions on semiconductor slices during their preparation.

It is a further object of the present invention to provide a suitable area on semiconductor elements for ohmic contacts of low resistance.

It is a still further object of the present invention to reduce the cost of fabrication and improve the quality of semiconductor devices.

In general, the present invention is organized about a technique of depositing an impurity on both sides of a semiconductor element in the conventional manner, but further by masking and painting steps to produce a superior device. Normally, the semiconductor element is in the form of a thin slice.

After the impurity is deposited over both sides of the slice of semiconductor material, the slice is cleaned, and a protective coating such as an oxide is deposited over the impurity. Next, the protective coating is removed from those areas of the slice where the impurity deposition is not wanted. These areas are then coated with a paint formed of a solution of an impurity of the opposite conductivity type to that of the junction-forming impurity. The usual diffusion operation is then conducted on the slice. For a better understanding of the present invention together with further objects, features and advantages, reference should be made to the following detailed description which should be read in conjunction with the accompanying drawings in which:

Figure 1:
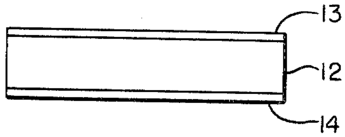
FIG. 1 is a cross-section of a slice of semiconductor material on which impurity has been deposited.
Figure 2:
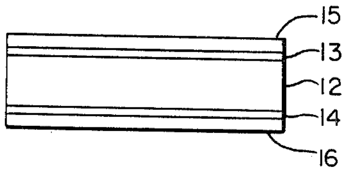
FIG. 2 is a cross-section of the same slice after oxidation.

In FIG. 1 the main body 12 of the semiconductor slice is shown as it appears after the deposit of an impurity such as boron has been made to form the layers 13 and 14 on opposite surfaces of the slice. After the deposit of boron, the slice is cleaned, and a protective coating, preferably an oxide, is formed to provide layers 15 and 16 over the deposited layer of boron. The oxidation may be effected in any one of several ways, but the preferred method is to use oxy-silane cracking as is well known in the fabrication of semiconductor devices.

Figure 3:
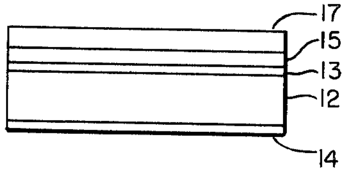
FIG. 3 is a section of the same slice after removal of the oxide from one side of the slice.

After the oxidation has been completed, one side of the slice is coated with a layer of wax 17. A black wax such as that sold commercially under the trade name "Apiezon" has proven to be satisfactory. The entire slice is then immersed in a solution of hydrofluoric acid to remove the oxide from the opposite uncoated side. The layer of wax 17 protects the oxide layer 15 from the action of the hydrofluoric acid. After the removal of the oxide from the uncoated side by the steps described, the unit appears as shown in FIG. 3 with only the single oxide layer 15 remaining.

Figure 4:
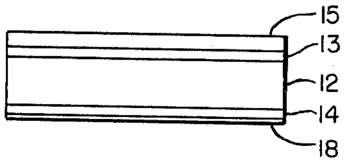
FIG. 4 is a cross-section of the same slice after the side from which the oxide has been removed is painted.

The black wax layer 17 is then removed by a suitable organic solvent, such as xylene or trichloroethylene. Following the removal of the wax layer, a coating of phosphor paint 18 is applied over the impurity layer 14. The device now appears as illustrated in FIG. 4. The paint may be brushed or painted on the impurity layer, and the material used need not be phosphor, but may be of any of several substances of the opposite type conductivity to that of the impurity layers 13 and 14. In the present instance, however, with the layers 13 and 14 being composed of boron, phosphor is preferred. One particular solution which has provided very satisfactory results includes 2 grams of nickel carbonate and 2 grams of phosphorous pentoxide in 40 cc. of methyl cellosolve. This solution is actually a standard phosphor paint which is well known throughout the industry.

After the application of the phosphor paint, the semiconductor slice is put through a conventional diffusing process in which the overdoping of the boron layer 14 by the phosphor layer 18 produces a high surface concentration of opposite conductivity type to that of the junction which is formed by the diffusion of the boron layer 13 into the semiconductor slice. The presence of the oxide layer 15 throughout the various steps of the process results in complete protection of the desired junction. This same oxide layer may further serve as a masking layer if, for example, it were desired to form holes by standard photo-resist techniques for emitter diffusion.

The high surface concentration of the overdope by the phosphor paint permits the formation of ohmic contacts of very low resistance, for example, in making a base connection in the fabrication of devices. Cross-contamination between the two opposite-type doping agents is completely eliminated by the protective effect of the oxide layer.

Although what has been described constitutes a preferred embodiment of the present invention, various modifications of the basic technique and substitution of various materials will suggest themselves to those skilled in the art. By way of example, other methods of oxidation than that described are contemplated by the invention, as are configurations other than slices of semiconductor material. Moreover, the technique, with minor variations, is applicable to germanium and other semiconducting elements and compounds. These and other variations are within the purview of the invention which should, accordingly, be limited only by the spirit and scope of the appended claims.

What is claimed is:

1. In a process of preparing a double diffused transsistor, the process of preparing a slice of semiconductor material as the operative element in said transistor which comprises the steps of depositing a first impurity of a first conductivity type over both sides of said slice, oxidizing the surfaces of said sides by oxy-silane cracking, removing the oxide from one side of said slice, painting said one side of said slice with a second impurity of a second conductivity type opposite to said first conductivity type, and diffusing said impurities into said slice, a junction being formed between said first impurity and said slice and a high surface concentration of said second impurity being developed at said one side of said slice.

2. In a process as defined in claim 1, removing said oxide from said one side of said slice by coating said oxide on the other side of said slice with black wax and immersing said slice in hydrofluoric acid to remove said oxide from said one side.

3. In a process of fabricating a double diffused transistor, the method of preparing a slice of semiconductor material as the operative element of said transistor which comprises the steps of depositing a layer of boron over the surfaces of said slice, forming a layer of stable oxide over said layer of boron by oxy-silane cracking, coating one side of said slice with wax applied over said oxide, immersing said slice in etchant to remove said oxide from areas of said slice not covered by said wax, removing said wax, painting the area from which said wax was removed with phosphor paint, and diffusing said boron into said slice to form a junction adjacent one surface of said slice and a high surface concentration of phosphor at another surface of said slice.

References Cited in the file of this patent

UNITED STATES PATENTS

| | | |
|---|---|---|
| 2,765,385 | Thomsen | Oct. 2, 1956 |
| 2,793,145 | Clarke | May 21, 1957 |
| 2,802,760 | Derick et al. | Aug. 13, 1957 |
| 2,804,405 | Derick et al. | Aug. 27, 1957 |
| 2,911,539 | Tanenbaum | Nov. 3, 1959 |
| 3,070,466 | Lyons | Dec. 25, 1962 |

OTHER REFERENCES

Aschner et al.: Journal of Electrochemical Society, May 1959, vol. 106, No. 5, pages 415–417.